United States Patent
Furman et al.

(10) Patent No.: US 8,731,074 B2
(45) Date of Patent: May 20, 2014

(54) COMMUNICATIONS DEVICE USING MEASURED FREQUENCY OFFSET OVER TIME TO ADJUST PHASE AND FREQUENCY TRACKING

(75) Inventors: William N. Furman, Fairport, NY (US); John W. Nieto, Rochester, NY (US); William L. Tyler, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 1645 days.

(21) Appl. No.: 12/212,020

(22) Filed: Sep. 17, 2008

(65) Prior Publication Data

US 2010/0067634 A1 Mar. 18, 2010

(51) Int. Cl.
*H04K 1/10* (2006.01)
*H03D 3/18* (2006.01)
*H04N 7/20* (2006.01)

(52) U.S. Cl.
USPC .............................. 375/260; 375/327; 725/70

(58) Field of Classification Search
USPC ..................................... 375/260, 327; 725/70
See application file for complete search history.

(56) References Cited

U.S. PATENT DOCUMENTS

| | | | |
|---|---|---|---|
| 5,034,748 A | 7/1991 | Goedeke et al. | 342/99 |
| 5,095,538 A | 3/1992 | Durboraw, III | 455/71 |
| 5,337,014 A | 8/1994 | Najle et al. | 324/613 |
| 5,392,450 A | 2/1995 | Nossen | 455/12.1 |
| 5,557,643 A * | 9/1996 | Kim et al. | 375/324 |
| 5,602,883 A * | 2/1997 | Stephens et al. | 375/376 |
| 5,692,023 A | 11/1997 | Clark | 375/376 |
| 5,726,607 A * | 3/1998 | Brede et al. | 331/2 |
| 5,732,105 A | 3/1998 | Andren et al. | 375/226 |
| 5,781,847 A * | 7/1998 | Clarke et al. | 455/69 |
| 5,812,927 A * | 9/1998 | Ben-Efraim et al. | 725/70 |
| 5,883,921 A | 3/1999 | Andren et al. | 375/208 |
| 6,535,549 B1 | 3/2003 | Scott et al. | 375/219 |
| 6,577,685 B1 | 6/2003 | Bao et al. | 375/327 |
| 6,621,857 B1 | 9/2003 | Belotserkovsky et al. | 375/149 |
| 6,696,886 B1 * | 2/2004 | Ke et al. | 327/553 |
| 7,019,684 B1 | 3/2006 | Spencer et al. | 342/62 |
| 7,027,535 B1 * | 4/2006 | Aftelak | 375/344 |
| 7,233,770 B2 | 6/2007 | Williamson et al. | 455/7 |
| 2002/0065038 A1 * | 5/2002 | Nawata | 455/12.1 |
| 2004/0009759 A1 * | 1/2004 | Mayor et al. | 455/258 |
| 2004/0058645 A1 * | 3/2004 | Brenner | 455/11.1 |
| 2004/0095196 A1 | 5/2004 | Maxim et al. | 331/17 |
| 2004/0114675 A1 * | 6/2004 | Crawford | 375/149 |
| 2005/0117681 A1 * | 6/2005 | Lee | 375/376 |
| 2006/0239458 A1 | 10/2006 | Bicksler et al. | 380/221 |
| 2007/0036253 A1 | 2/2007 | Seo et al. | 375/354 |
| 2007/0081579 A1 * | 4/2007 | Kostic et al. | 375/149 |
| 2008/0089270 A1 | 4/2008 | Norris et al. | 370/319 |
| 2008/0123779 A1 | 5/2008 | Norris | 375/326 |

* cited by examiner

*Primary Examiner* — Chieh M Fan
*Assistant Examiner* — Sarah Hassan
(74) *Attorney, Agent, or Firm* — Allen, Dyer, Doppelt, Milbrath & Gilchrist, P.A.

(57) ABSTRACT

The communications device includes a phase and frequency tracking loop having a signal input and an adjustable loop filter that establishes a predetermined tracking loop bandwidth for samples of communication signals received at the signal input and processed within the tracking loop. A tracking loop update circuit updates loop filter operating parameters and is operative with the loop filter for increasing or decreasing the tracking loop bandwidth of the phase and frequency tracking loop based on the dynamics of the frequency offset of measured samples from the output of the loop filter over time.

23 Claims, 8 Drawing Sheets

COMMUNICATIONS DEVICE USING MEASURED FREQUENCY OFFSET OVER TIME TO ADJUST PHASE AND FREQUENCY TRACKING

FIELD OF THE INVENTION

The present invention relates to communications systems and, more particularly, the present invention relates to communications devices and related systems and methods that track phase and Doppler (or frequency) error.

BACKGROUND OF THE INVENTION

Some multi-band or other tactical radios and operate in the high frequency (HF), very high frequency (VHF) (for satellite communications), and ultra high frequency (UHF) bands. The range of some multi-band tactical radios can operate from about 2 through about 512 MHz frequency range in some non-limiting examples. The latest generation radios cover about 2.0 to about 2,000 MHz (or higher) to accommodate high data rate waveforms and less crowded frequency bands. The high frequency (HF) transmit mode is governed by standards such as MIL-STD-188-141B, while data modulation/demodulation is governed by standards such as MIL-STD-188-110B, the disclosures which are incorporated by reference in their entirety.

UHF standards, on the other hand, provide different challenges over the 225 to about 512 MHz frequency range, including short-haul line-of-sight (LOS) communication and satellite communications (SATCOM) and cable. This type of propagation can be obtained through different weather conditions, foliage and other obstacles making UHF SATCOM an indispensable communications medium for many agencies. Different directional antennas can be used to improve antenna gain and improve data rates on the transmit and receive links. This type of communication is typically governed in one example by MIL-STD-188-181B, the disclosure which is incorporated by reference in its entirety. This standard provides a family of constant and non-constant amplitude waveforms for use over satellite links.

The joint tactical radio system (JTRS) is one example of a system that implements some of these standards and has different designs that use oscillators, mixers, switchers, splitters, combiners and power amplifier devices to cover different frequency ranges. The modulation schemes used for these types of systems can occupy a fixed bandwidth channel at a fixed frequency spectrum. These systems usually utilize a memoryless modulation, such as phase shift keying (PSK), amplitude shift keying (ASK), frequency shift keying (FSK), quadrature amplitude modulation (QAM), or modulations with memory such as continuous phase modulation (CPM) and may sometimes combine them with a convolutional or other type of forward error correction (FEC) code. Minimum shift keying (MSK) and Gaussian minimum shift keying (GSMK) (together referred to as MSK or GMSK) are a form of continuous phase modulation used in the Global System for Mobile communications (GSM) and can be used with such systems. The circuits used for implementing the MSK waveform could include a continuous phase frequency shift keying (FSK) modulator.

Some of these radios use DAMA satellite communication networks, which have enjoyed widespread use in a variety of applications, such as, but not limited to military environments. In certain military applications, an established requirement issued by the Department of Defense, known as MIL-STD-188-183 and 183A, the disclosure which is hereby incorporated by reference in its entirety, sets forth interoperability standards with which (5 KHz and 25 KHz UHF) satellite communication equipment must conform. A reduced complexity example of such a SATCOM network is diagrammatically illustrated in FIG. 1 and includes a (geosynchronous) communication satellite 10 and a plurality of (mobile) terrestrial transceivers/radios 12.

DAMA is a technique that increases the amount of users that a limited "pool" of satellite transponder space can support. The ability to share bandwidth is based on the theory that not all users will require simultaneous access to communication channels. DAMA systems quickly and transparently assign communication links or circuits based on requests issued from user terminals to a network control system. When the circuit is no longer in use, the channels are immediately returned to the central pool, for reuse by others. By using DAMA, many subscribers can be served using only a fraction of the satellite resources required by dedicated, point-to-point single-channel-per-carrier networks, thus reducing the costs of satellite networking.

Existing MIL-STD-188-183 and 183A terminals require acquisition and demodulation of various Phase Shift Keying (PSK) modulation types, such as Shaped Offset Quadrature Phase Shift Keying (SOQPSK), Differential Encoded Quadrature Phase Shift Keying (DEQPSK), and Binary Phase Shift Keying (BPSK) modulation types. New MIL-STD-188-181C (Integrated Waveform) requires acquisition and demodulation of Continuous Phase Modulation (CPM) types (in addition to legacy waveforms such as BPSK, DEQPSK, and SOQPSK). The specified preamble phasing sequence for each of the modulation types is similar. The required Signal-to-Noise Ratio (SNR) requires advanced signal processing techniques to recover symbol frequency offset, phase offset, and timing.

Existing DAMA terminals and controllers acquire the modulation preamble by predefining the modem baud rate and correlating for the specific modem phasing pattern and start-of-message bit sequence. Baud is a measure of the bit rate, i.e. the number of distinct symbolic changes (signaling event) made to the transmission medium per second in a digitally modulated signal. As each symbol may stand for more than one bit of information, the amount of information sent per second is the product of the rate in baud and the number of bits of information represented by each symbol. The baud rate is equal to the symbol rate times the number of bits per symbol.

One multiband radio sold under the designation AN/PRC-117F(C) is a multiband, multimission, software-defined radio, for example, the Falcon II Manpack from Harris Corporation of Melbourne, Fla. This radio uses BPSK, DEQPSK and the SOQPSK waveforms for DAMA operation. In many of these communications systems, DAMA waveforms have a 32 Hz/sec Doppler tracking design objective to allow for airborne operation. In the radio receiver, the RF circuitry shifts or demodulates an information bearing component of a received signal back to baseband by multiplying it with a local reference of frequency $F_c$. This carrier recovery also is termed phase tracking and must be very accurate to determine data bit values represented by received symbols. The downconversion can be difficult because of phase variations introduced by Doppler shifting as the transmitted signal passes through a channel because of the relative motion between a transmitter and receiver in wireless systems. Also, a local reference at a transmitter could be out of phase with the local reference at the receiver and the phase error could be time varying.

At lower symbol rates, for example, at 600 and 1,200 symbol rates, the traditional phase and Doppler (frequency) offset tracking approaches suffer, especially at a lower signal-to-noise (Eb/No) ratio. It has been found that the bandwidth of a traditional tracking loop is required to be wide to track 32 Hz/sec. In some systems, however, this type of wide bandwidth tracking loop allows greater noise at lower Eb/No, which causes the loop to track off the desired offset.

To overcome these detriments, some communications devices use a phase estimator as a low pass filter while others have used a phase-locked loop (PLL) circuit with a tracking bandwidth that is set and based on a maximum offset that is allowed under the circuit and communications conditions. The phase-locked loop circuits typically incorporate a filter bandwidth reduction after the signal acquisition.

These approaches provide some remedial effect, but do not always adequately perform under all circumstances and greater enhancements to Doppler (frequency) and phase tracking are desired.

SUMMARY OF THE INVENTION

The communications device includes a phase and frequency tracking loop having a signal input and an adjustable loop filter that establishes a predetermined tracking loop bandwidth for samples of communication signals received at the signal input and processed within the tracking loop. A tracking loop update circuit updates loop filter operating parameters and is operative with the loop filter for increasing or decreasing the tracking loop bandwidth of the phase and frequency tracking loop based on the dynamics of the frequency offset of measured samples from the output of the loop filter over time.

In one aspect, the tracking loop update circuit includes a frequency offset and frequency-delta tracking circuit that is operative for determining the dynamics of the frequency offset of measured samples from the loop filter over time. A signal-to-noise ratio estimator can receive samples of communication signals and estimate the signal-to-noise level within the communication signals that are output by the tracking loop. The tracking loop update circuit can update the loop filter operating parameters based on the frequency offset of measured samples from the output of the loop filter over time, the measured signal-to-noise ratio and the symbol rate of communication signal.

In another aspect, the tracking bandwidth within the phase and frequency tracking loop is reduced when the signal-to-noise ratio within received samples of communication signals has been reduced.

A symbol rate configuration circuit can determine the demodulator tracking capabilities based on the symbol rate and can be used by the tracking loop update circuit to update the tracking loop parameters. Also, a burst history circuit can maintain a history of previous signal reception to determine a signal burst history, which can also be used by the tracking loop update circuit to update tracking loop parameters. In one aspect, the tracking loop update circuit includes a filter bandwidth logic circuit connected to the loop filter that calculates the updated filter parameters and generates the updated filter parameter to the loop filter. The phase and frequency tracking loop can be formed as a phased-locked loop circuit that includes a mixer connected to the signal input, a phase detector that receives signals output from the mixer and connected to the loop filter and a numerically-controlled oscillator connected to the mixer and the output of the loop filter. The tracking loop update circuit can be operative for updating filter parameters for tracking a Demand Assigned Multiple Access (DAMA) waveform. A demodulator can incorporate the phase and frequency tracking loop and the tracking loop update circuit in one aspect.

In another aspect, a phase-locked loop circuit and method are set forth.

BRIEF DESCRIPTION OF THE DRAWINGS

Other objects, features and advantages of the present invention will become apparent from the detailed description of the invention which follows, when considered in light of the accompanying drawings in which.

FIG, 7 is a high-level block diagram showing basic components of a communications device that can be used and modified in accordance with a non-limiting example of the present invention.

Figure 8:
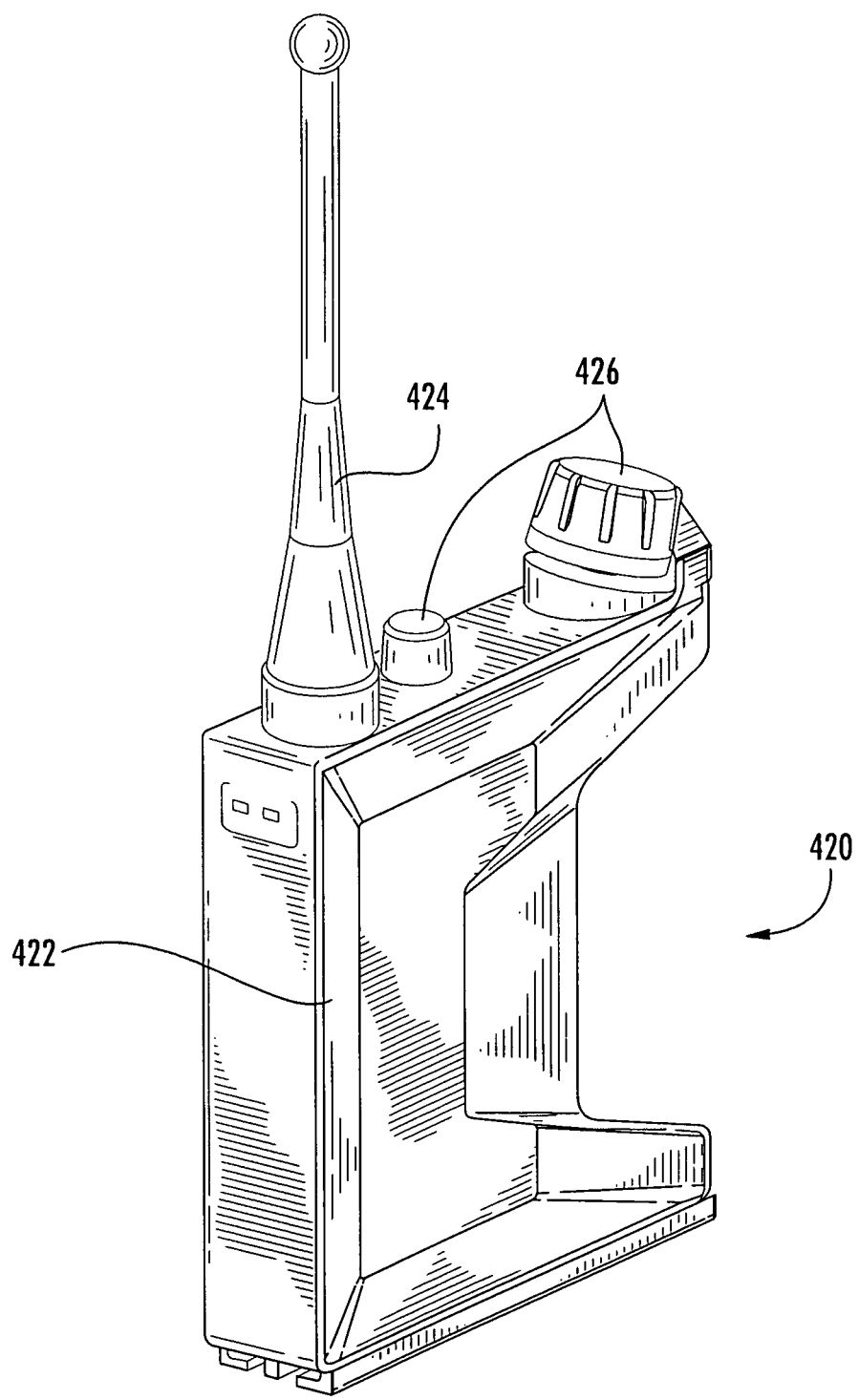

FIG. 8 is a perspective view of a portable wireless communications device as a handheld radio that could incorporate the communications system and radio as a communications device modified to work in accordance with a non-limiting example of the present invention.

DETAILED DESCRIPTION OF THE PREFERRED EMBODIMENTS

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art. Like numbers refer to like elements throughout.

It should be appreciated by one skilled in the art that the approach to be described is not limited for use with any particular communication standard (wireless or otherwise) and can be adapted for use with numerous wireless (or wired) communications standards such as Enhanced Data rates for GSM Evolution (EDGE), General Packet Radio Service (GPRS) or Enhanced GPRS (EGPRS), extended data rate Bluetooth, Wideband Code Division Multiple Access (WCDMA), Wireless LAN (WLAN), Ultra Wideband (UWB), coaxial cable, radar, optical, etc. Further, the invention is not limited for use with a specific physical layer (PHY) device or radio type but is applicable to other compatible technologies as well.

Throughout this description, the term communications device is defined as any apparatus or mechanism adapted to transmit, receive or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof. Wireless communication involves: radio frequency communication; microwave communication, for example long-range line-of-sight via highly directional antennas, or short-range communication; and/or infrared (IR) short-range communication. Applications may involve point-to-point communication, point-to-multipoint communication, broadcasting, cellular networks and other wireless networks.

As will be appreciated by those skilled in the art, a method, data processing system, or computer program product can embody different examples in accordance with a non-limiting example of the present invention. Accordingly, these portions may take the form of an entirely hardware embodiment, an entirely software embodiment, or an embodiment combining software and hardware aspects. Furthermore, portions may be a computer program product on a computer-usable storage medium having computer readable program code on the medium. Any suitable computer readable medium may be utilized including, but not limited to, static and dynamic storage devices, hard disks, optical storage devices, and magnetic storage devices.

The description as presented below can apply with reference to flowchart illustrations of methods, systems, and computer program products according to an embodiment of the invention. It will be understood that blocks of the illustrations, and combinations of blocks in the illustrations, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, implement the functions specified in the block or blocks.

These computer program instructions may also be stored in a computer-readable memory that can direct a computer or other programmable data processing apparatus to function in a particular manner, such that the instructions stored in the computer-readable memory result in an article of manufacture including instructions which implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart block or blocks.

Figure 1:
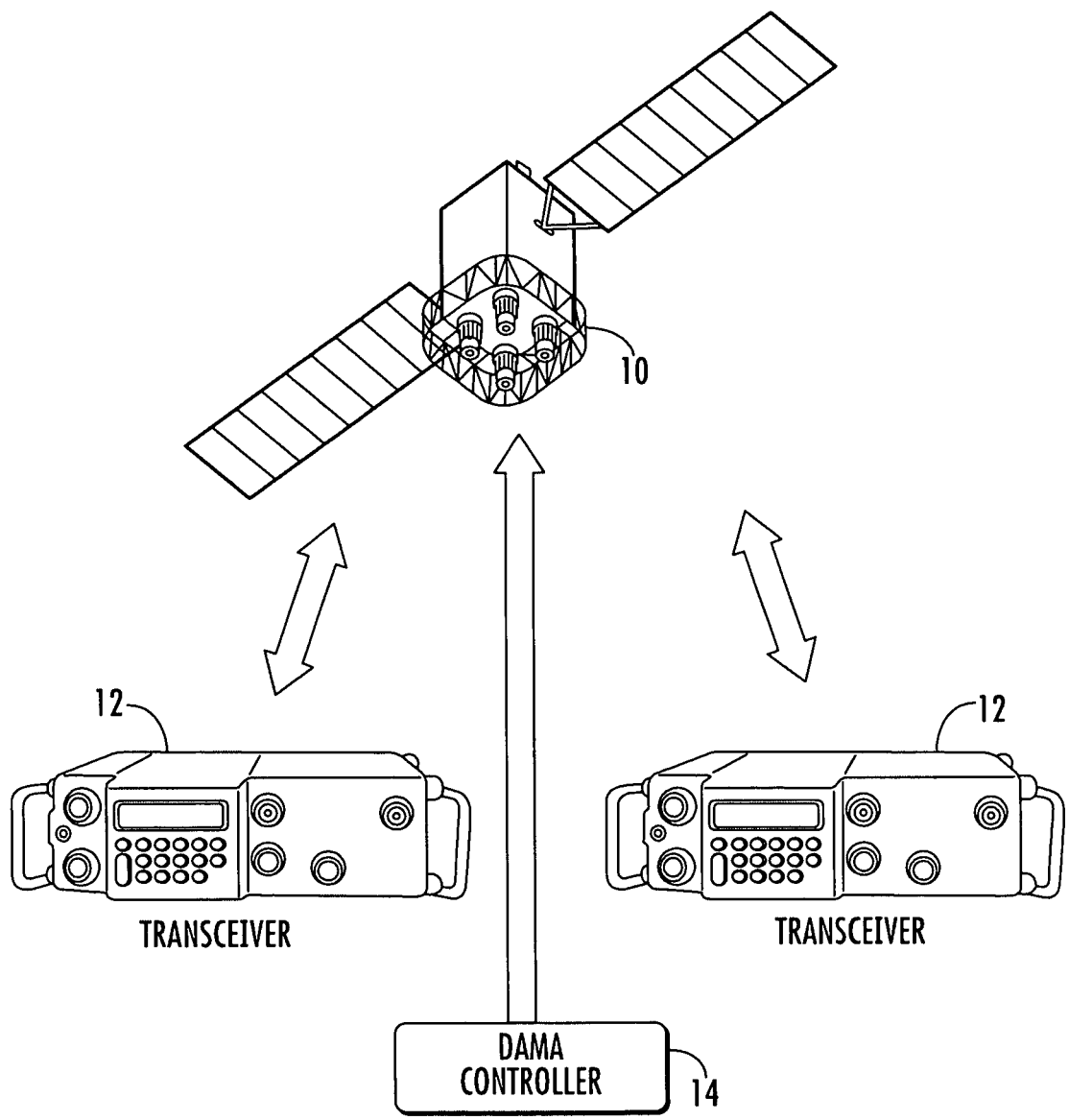
FIG. 1 is a reduced complexity illustration of a DAMA satellite communications network.

FIG. 1 shows a satellite communications network that uses a DAMA controller 14 and operable with a satellite 10 and two transceivers 12 as radio devices. In this particular system, the controller is a rack-mounted unit separate from the radio devices. FIG. 1 shows that some radio devices that communicate using DAMA incorporate use of a DANA controller.

Figure 2:
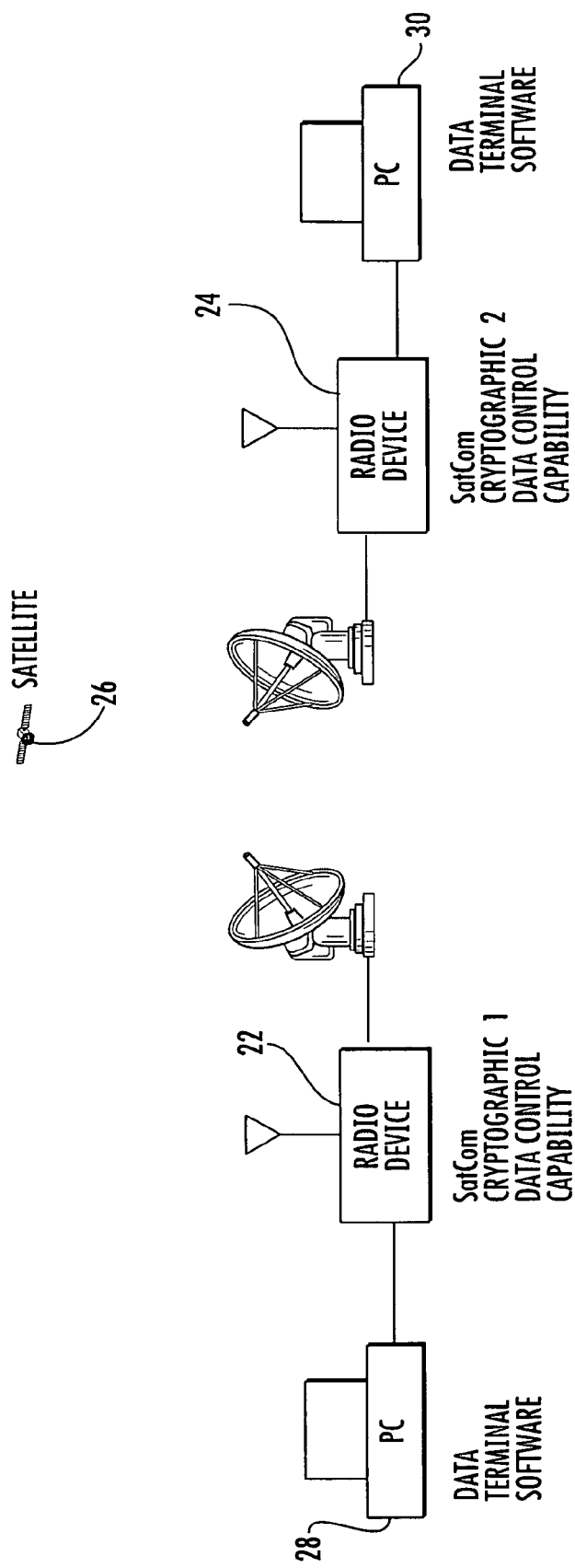
FIG. 2 is another example of a satellite communications network using radio devices with functionality for DAMA communications in accordance with a non-limiting example of the present invention.

FIG. 2 shows another communications system 20 using transceivers as radio or communications devices 22, 24 that communicate through an antenna with the satellite 26. The radio devices 22, 24 are an integrated communications device such as a Harris AN/PRC-117F(C) radio that is operable as a satellite communications radio and includes cryptographic capability and operates as an advanced data controller. This radio can operate with various terminals such as portable personal computers or ground station that incorporates a data terminal software.

As a non-limiting example of the type of radio communications device that can be modified and used in accordance with non-limiting examples, the Harris AN/PRC-117F(C) multiband, multimission, manpack radio is an advanced software-defined radio, covering the entire 30 to 512 MHz frequency spectrum. The AN/PRC-117F(C) has embedded Communications Security (COMSEC), Transmission Security (TRANSEC) and is fully compatible with VINSON, ANDVT/KYV-5, KG-84C and 12 kbps fascinator encryption in voice and data modes with full over-the-air-rekeying (OTAR) capability. The radio can store up to 75 COMSEC keys and support DS-101, DS102 fill and CT3 interfaces using all common fill devices.

An embedded software programmable JITC certified SATCOM and Demand Assigned Multiple Access (DAMA) modem complies with DOD MIL-STD-188-181B, 182-/A, and 183-/A revisions. Mixed Excitation Linear Prediction (MELP) digitized voice improves narrowband voice communications and is MIL-STD-3005 compliant with other MELP radios. A programmable SATCOM table can be custom built for international SATCOM requirements. The system also features SATCOM Situational Awareness (SA).

The AN/PRC-117F(C) radio has SINCGARS and Havequick I/II ECCM frequency hopping ESIP and ASIP modes that are supported along with ICOM mode 2/3 SINCGARS with manual or global positioning system (GPS) and time of day (TOD) clock synchronization capability and SA (Software Acquisition) capability.

A High Performance Waveform (HPW) data waveform can securely transmit and receive email and transfer large files over SATCOM and line of site (LOS) AM/FM nets by adapting to varying channel conditions. HPW ensures error free data delivery using high-speed, over-the-air data rates up to 64 kbps on LOS nets and up to 56 kbps on wideband SATCOM nets. Channel SCAN provides monitoring of up to 10 SATCOM or LOS nets. Both CDCSS and CTCSS squelch tone support is provided in transmit and receive, for LMR repeater systems, and FRS nets.

A removable keypad/display unit provides better control when on the move with a full function remote control capability. A menu-driven interface allows programming and control of 100 nets. Cable radio cloning is standard, or optional wireless radio cloning along with the Radio Programming Application (RPA) ensure critical communications nets are quickly and accurately programmed and established.

The AN/PRC-117F(C) is a non-limiting example of a radio device that can use DAMA and communicate by assigning a bandwidth to clients that do not need require it constantly. DAMA systems assign communication channels or circuits based on requests issued from user terminals to a network control system. When the circuit is no longer in use, the channels are then returned to the central pool for reuse by others. Channels are typically a pair of carrier frequencies (one for transmit and one for receive), but can include fixed bandwidth resources such as timeslots in a TDMA burst plan. Once allocated to a pair of nodes, this bandwidth is not available to other users in the network until their session is finished. DAMA permits use of one channel (Frequency band, timeslot, etc.) by many users at different times. This technology is mainly used by small clients as opposed to PAMA (Permanently Assigned Multiple Access). By using DAMA technology, the amount of users that can use a limited pool of circuits can be greatly increased.

DAMA and PAMA are related only to bandwidth assignment and are not to be mixed with the multiple access methods intended to divide a bandwidth between several users at one time, which include FDMA, TDMA, CDMA and others. These systems typically allow a more deterministic near real time allocation of bandwidth based on demands and data priority. DAMA is widely used in satellite communications, especially in VSAT systems.

In accordance with a non-limiting example, a phase and frequency tracking loop circuit, also called adaptive tracking loop such as a modified phase-locked loop circuit, is operative with a tracking loop update circuit to update loop filter operating parameters and increase or decrease the tracking loop bandwidth of the phase and frequency tracking loop based on additional performance metrics and estimates of channel parameters as explained in greater detail below. These could be based on signal-to-noise ratio, symbol rate configuration as data rate, rate of Doppler or frequency change tracking, measured sampled values and history of previous receptions as non-limiting examples. It should be understood that each data rate has a different capability in terms of tracking. For example, lower symbol rates (i.e. 600 symbols per second) have more difficulty tracking 32 Hz/sec than higher symbol rates (i.e. 2400 symbols per second).

The tracking loop update circuit includes in one aspect a signal-to-noise (Eb/No) estimator that reduces the tracking bandwidth based on the current symbol rate and on when the signal-to-noise ratio goes low. This signal-to-noise estimator combined with the current symbol rate are part of the tracking loop update circuit which allows tracking of large Doppler (frequency) at high Eb/No while not impairing demodulator performance of lower Doppler error at low Eb/No. The tracking loop update circuit can also provide a frequency offset and frequency-delta tracking for an estimate coherence using dynamics of the frequency offset and frequency-delta tracking circuit. If the adaptive phase and frequency tracking loop appears to be stabilizing, it can reduce the tracking bandwidth and update the frequency offset estimate based on the delta or change in frequency history. The tracking loop update circuit can also maintain transmission history with a time-out and use previous burst information to aid a current burst. The circuit as described requires cooperation between the PHY (Physical) and MAC (Media Access Control) layers and knowledge concerning the waveform symbol data rate.

Figure 3:
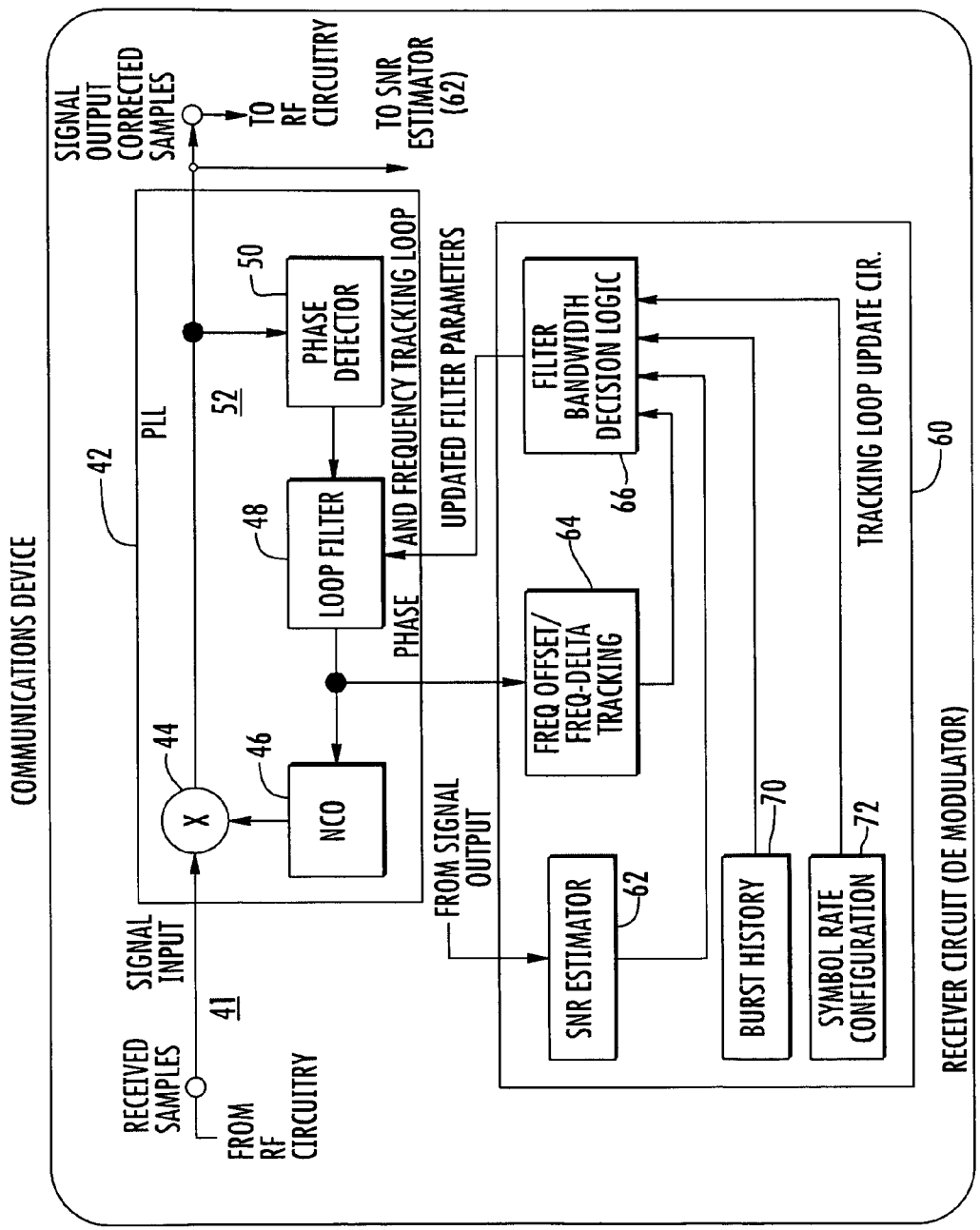
FIG. 3 is a block diagram showing part of a radio communications device with a phase-locked loop (PLL) circuit as an adaptive phase and frequency tracking loop circuit in accordance with a non-limiting example of the present invention.

FIG. 3 is a block diagram showing part of a receiver circuit used in the radio communications device indicated generally by the outline at 40. This circuit could be part of a demodulator in a receiver. The circuit has a signal input 41 for received samples of communications signals processed typically by other portions of the RF circuitry that are passed into a phase-locked loop circuit 42 as the adaptive phase and frequency tracking loop that includes a mixer 44, numerically-controlled oscillator (NCO) 46, adjustable loop filter 48 and phase detector 50 all in a phase-locked loop configuration shown at 52. As will be explained below, the adjustable loop filter 48 receives updated filter parameters from the tracking loop update circuit 60 to increase or decrease the tracking loop bandwidth as necessary. This can be based on the signal-to-noise ratio, symbol rate, rate of Doppler (frequency) change tracking capability of the waveform, based on measured and sampled values over time, plus the history of previous receptions as non-limiting examples.

The numerically-controlled oscillator (NCO) 46 can be a digitally-controlled oscillator that synthesizes a range of frequencies from a fixed time base and is typically analogous with the voltage-controlled oscillator (VCO). It could also be a voltage-controlled oscillator driven by a control signal from a digital-to-analog converter. In conjunction with a phase-locked loop analog frequency synthesizer, it can synthesize precise frequency ratios and generate spectral sidebands symmetrically on either side of a time base frequency. It could include a phase accumulator that operates similar to a digital waveform generator by incrementing a phase counter by a per-sample increment and a phase-to-amplitude converter such as part of a memory device where phase values can be looked up in a waveform table to create a sine waveform at a desired phase offset. A digital-to-analog converter (DAC) can be used to produce an analog waveform. It can include a digital counter to produce square wave signals that are accurate.

Part of the received samples after entering the phase and frequency tracking loop circuit 42 are passed into the tracking loop update circuit 60 that includes a signal-to-noise estimator 62, which receives the samples from the output of the phase and frequency tracking loop circuit 42. A frequency offset and frequency-delta tracking circuit 64 receives feedback signals after filtering in the adjustable loop filter 48 as illustrated. Circuit 64 is operative for determining the frequency offset of measured samples from the loop filter over time. A filter bandwidth decision logic circuit 66 receives information regarding the signal-to-noise ratio and the frequency offset and frequency-delta tracking as well as the burst history and symbol rate configuration from a respective burst history circuit 70 and symbol rate configuration circuit 72. The filter bandwidth decision logic circuit 66 calculates the updated filter parameters and passes them to the adjustable loop filter 48.

The burst history circuit 70 receives data regarding a history of previous receptions and maintains a history of previous signal receptions to determine a signal burst history. The symbol rate configuration circuit 72 has apriori knowledge (i.e. a pre-computed look-up table or a set of rules) of the tracking capabilities of the waveform demodulator based on the symbol rate and SNR. The information from both circuits can also be used to increase or decrease the tracking bandwidth of the tracking loop circuit 42.

The history of previous receptions can be used for adjusting the loop filter 48 to aid in tracking bandwidth and processing a current communication signal. Also, it should be understood that the adjustable loop filter can be designed with different circuits. The circuits shown in FIG. 3, including the phase and frequency tracking loop 42 and tracking loop update circuit 60, can be formed as distinct modules or formed monolithically on one integrated circuit or be two separate integrated circuits. The adjustable loop filter 48 can adjust the ratio of poles as derived from a transfer function. A smaller loop bandwidth could typically imply that reference spurs are smaller while a larger bandwidth could imply a faster lock time. The loop filter 48 can adjust the phase margin and increase or decrease the value of attenuation, for example, it could increase the value of attenuation and obtain a more narrow bandwidth. The circuit could be designed to change the circuit capacitance and accomplish a tuning range change of the loop filter.

Figure 4:
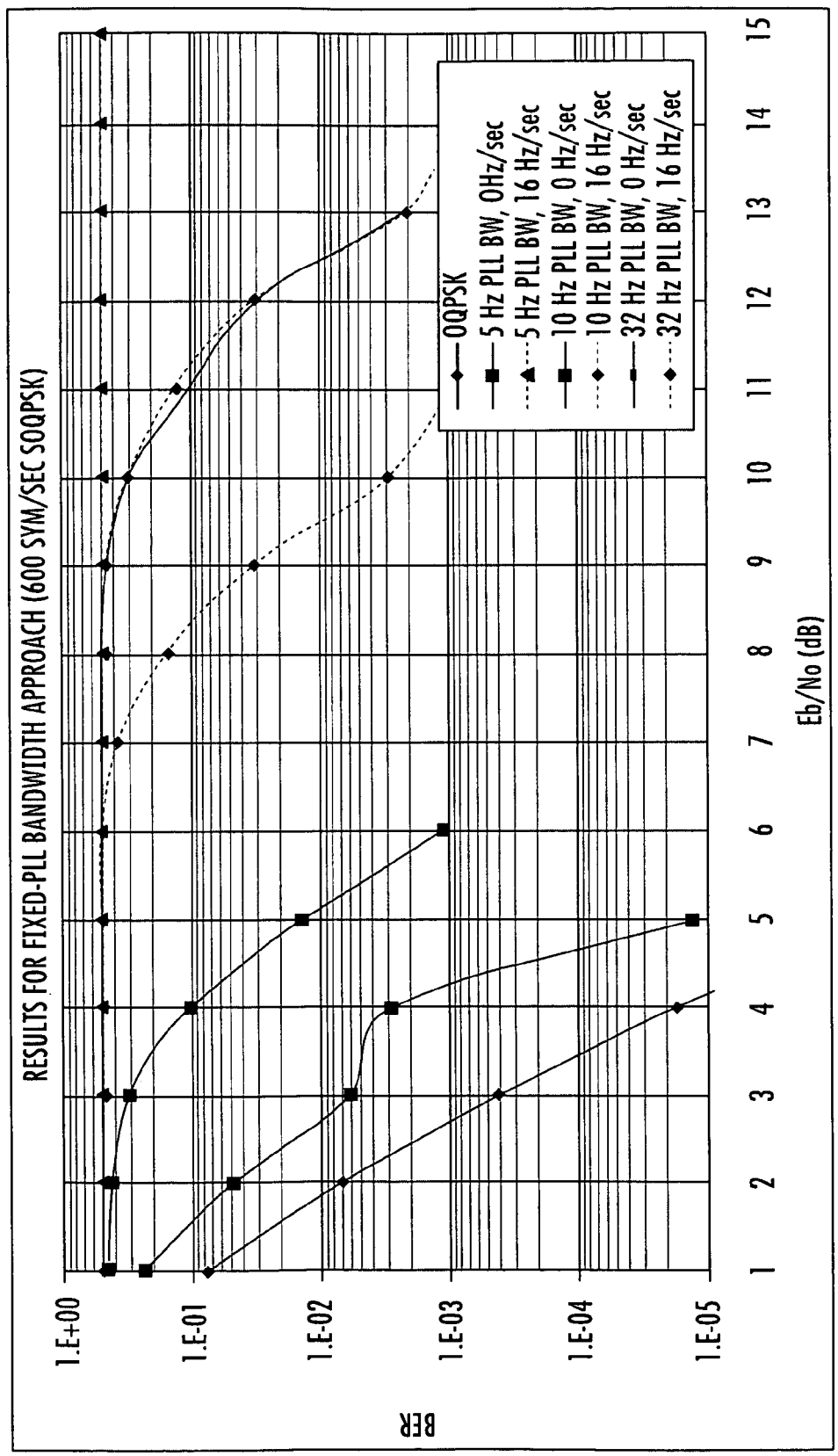
FIG. 4 is a graph showing results for a conventional fixed-PLL bandwidth approach in tracking such as for 600 SYM/SEC SOQPSK.

FIG. 4 is a graph showing results for a conventional circuit using a fixed phased-locked loop bandwidth approach with 600 SYMBOLS/SEC SOQPSK and showing different bandwidths. If the wrong tracking is established, this graph illustrates the bit error rate (BER) and the problems that occur.

Figure 5:
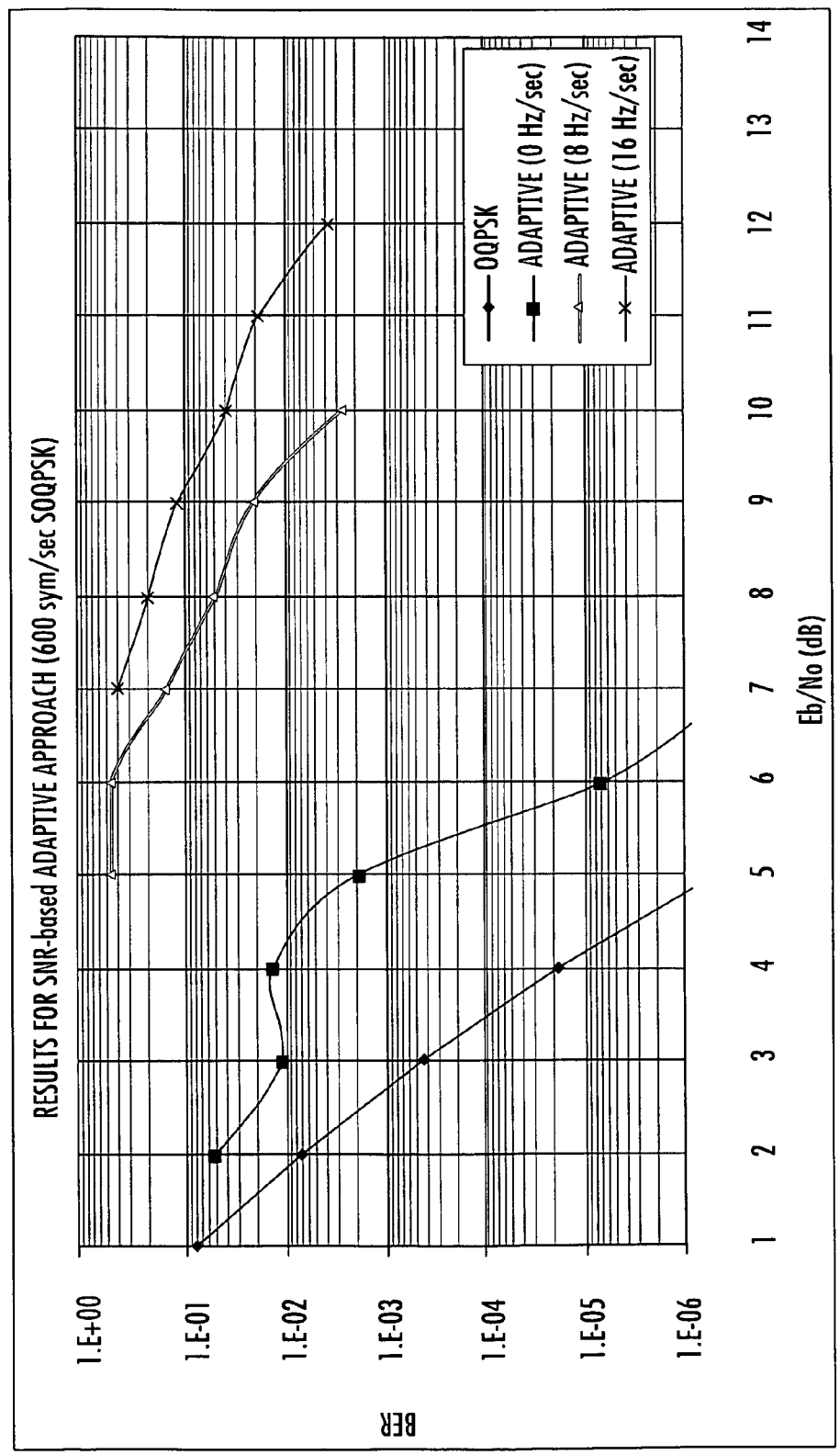
FIG. 5 is a graph showing results for an adaptive approach that incorporates the adaptive phase and frequency tracking loop circuit with 600 SYM/SEC SOQPSK in accordance with a non-limiting example of the present invention.

FIG. 5, on the other hand, is a graph showing the results for the adaptive phase and frequency tracking loop circuit using phase and frequency tracking as a Eb/No and symbol rate based adaptive approach using the updated filter parameters received into the loop filter 42 shown in FIG. 3 with an example of 600 SYM/SEC SOQPSK. The graph shows the advantageous results with the bit error rate (BER).

Thus, the system and method using the radio communications device and circuit shown in FIG. 3 allows the additional performance metrics and estimates of channel parameters to adjust the dynamic tracking capability of the adaptive phase and frequency tracking loop as described. This can provide a performance improvement over many legacy radios.

Figure 6:
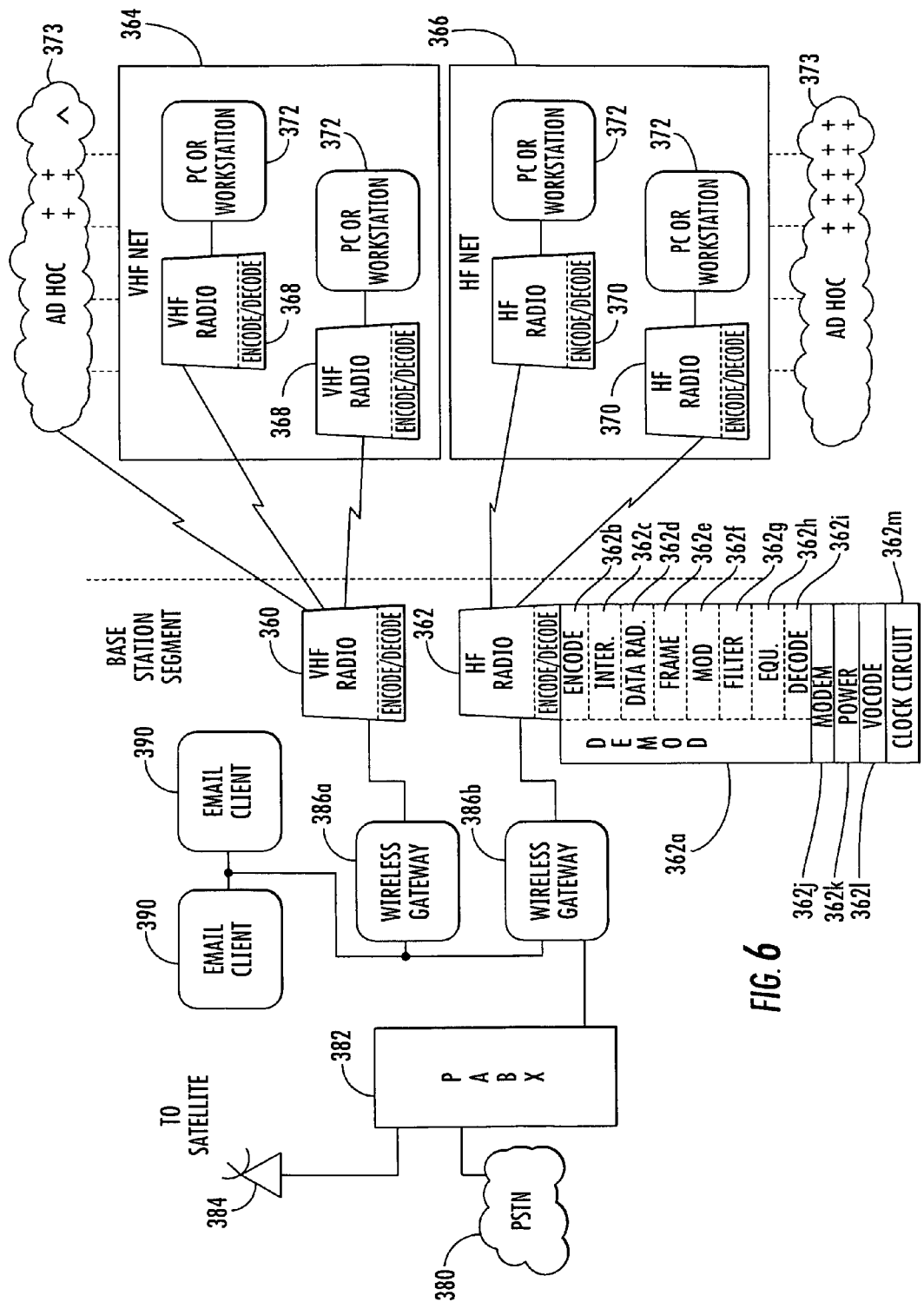
FIG. 6 is a block diagram of an example of a communications system with various communications devices that can be used and modified in accordance with a non-limiting example of the present invention.

For purposes of description, some further information on coding, interleaving, and an exemplary wireless, mobile radio communications system that includes ad-hoc capability and can be modified for use is set forth. This example of a communications system that can be used and modified in accordance with the present invention is now set forth with regard to FIGS. 6 and 7. FIGS. 6 shows a number of radio devices that could be transmitters and receivers.

An example of a radio that could be used with such system and method is a Falcon™ III radio manufactured and sold by Harris Corporation of Melbourne, Fla. This type of radio can support multiple wavebands form 30 MHz up to 2 GHz, including L-band SATCOM and MANET. The waveforms can provide secure IP data networking. It should be understood that different radios can be used, including software defined radios that can be typically implemented with relatively standard processor and hardware components. One particular class of software radio is the Joint Tactical Radio (JTR), which includes relatively standard radio and processing hardware along with any appropriate waveform software modules to implement the communication waveforms a radio will use. JTR radios also use operating system software that conforms with the software communications architecture (SCA) specification (see www.jtrs.saalt.mil), which is hereby incorporated by reference in its entirety. The SCA is an open architecture framework that specifies how hardware and software components are to interoperate so that different manufacturers and developers can readily integrate the respective components into a single device.

The Joint Tactical Radio System (JTRS) Software Component Architecture (SCA) defines a set of interfaces and protocols, often based on the Common Object Request Broker Architecture (CORBA), for implementing a Software Defined Radio (SDR). In part, JTRS and its SCA are used with a family of software re-programmable radios. As such, the SCA is a specific set of rules, methods, and design criteria for implementing software re-programmable digital radios.

The JTRS SCA specification is published by the JTRS Joint Program Office (JPO). The JTRS SCA has been structured to provide for portability of applications software between different JTRS SCA implementations, leverage commercial standards to reduce development cost, reduce development time of new waveforms through the ability to reuse design modules, and build on evolving commercial frameworks and architectures.

The JTRS SCA is not a system specification, as it is intended to be implementation independent, but a set of rules that constrain the design of systems to achieve desired JTRS objectives. The software framework of the JTRS SCA defines the Operating Environment (OE) and specifies the services and interfaces that applications use from that environment. The SCA OE comprises a Core Framework (CF), a CORBA middleware, and an Operating System (OS) based on the Portable Operating System Interface (POSIX) with associated board support packages. The JTRS SCA also provides a building block structure (defined in the API Supplement) for defining application programming interfaces (APIs) between application software components.

The JTRS SCA Core Framework (CF) is an architectural concept defining the essential, "core" set of open software Interfaces and Profiles that provide for the deployment, management, interconnection, and intercommunication of software application components in embedded, distributed-computing communication systems. Interfaces may be defined in the JTRS SCA Specification. However, developers may implement some of them, some may be implemented by non-core applications (i.e., waveforms, etc.), and some may be implemented by hardware device providers.

For purposes of description only, a brief description of an example of a communications system that includes communications devices that incorporate the phase and Doppler (frequency) tracking, in accordance with a non-limiting example, is described relative to a non-limiting example shown in FIG. 6. This high-level block diagram of a communications system includes a base station segment and wireless message terminals that could be modified for use with the present invention. The base station segment includes a VHF radio 360 and HF radio 362 that communicate and transmit voice or data over a wireless link to a VHF net 364 or HF net 366, each which include a number of respective VHF radios 368 and HP radios 370, and personal computer workstations 372 connected to the radios 368,370. Ad-hoc communication networks 373 are interoperative with the various components as illustrated. The entire network can be ad-hoc and include source, destination and neighboring mobile nodes. Thus, it should be understood that the HF or VHF networks include HF and VHF net segments that are infrastructure-less and operative as the ad-hoc communications network. Although UHF and higher frequency radios and net segments are not illustrated, these are included for DAMA and satellite operation The radio can include a demodulator circuit 362a and appropriate convolutional encoder circuit 362b, block interleaver 362c, data randomizer circuit 362d, data and framing circuit 362e, modulation circuit 362f, matched filter circuit 362g, block or symbol equalizer circuit 362h with an appropriate clamping device, deinterleaver and decoder circuit 362i modem 362j, and power adaptation circuit 362k as non-limiting examples. A vocoder circuit 3621 can incorporate the decode and encode functions and a conversion unit could be a combination of the various circuits as described or a separate circuit. A clock circuit 362m can establish the physical clock time and through second order calculations as described below, a virtual clock time. The network can have an overall network clock time. These and other circuits operate to perform any functions necessary for the present invention, as well as other functions suggested by those skilled in the art. Other illustrated radios, including all VHF (or UHF) and higher frequency mobile radios and transmitting and receiving stations can have similar functional circuits. Radios could range from 30 MHz to about 2 GHz as non-limiting examples.

The base station segment includes a landline connection to a public switched telephone network (PSTN) 380, which connects to a PABX 382. A satellite interface 384, such as a satellite ground station, connects to the PABX 382, which connects to processors forming wireless gateways 386a, 386b. These interconnect to the UHF, VHF radio 360 or HF radio 362, respectively. The processors are connected through a local area network to the PABX 382 and e-mail clients 390. The radios include appropriate signal generators and modulators.

An Ethernet/TCP-IP local area network could operate as a "radio" mail server. E-mail messages could be sent over radio links and local air networks using STANAG-5066 as second-generation protocols/waveforms, the disclosure which is hereby incorporated by reference in its entirety and, of course, preferably with the third-generation interoperability standard: STANAG-4538, the disclosure which is hereby incorporated by reference in its entirety. An interoperability standard FED-STD-1052, the disclosure which is hereby incorporated by reference in its entirety, could be used with legacy wireless devices. Examples of equipment that can be used in the present invention include different wireless gateway and radios manufactured by Harris Corporation of Melbourne, Fla. This equipment could include RF5800, 5022, 7210, 5710, 5285 and PRC 117 and 138 series equipment and devices as non-limiting examples.

These systems can be operable with RF-5710A high-frequency (HF) modems and with the NATO standard known as STANAG 4539, the disclosure which is hereby incorporated by reference in its entirety, which provides for transmission of long distance radio at rates up to 9,600 bps. In addition to modem technology, those systems can use wireless email products that use a suite of data-link protocols designed and perfected for stressed tactical channels, such as the STANAG 4538 or STANAG 5066, the disclosures which are hereby incorporated by reference in their entirety. It is also possible to use a fixed, non-adaptive data rate as high as 19,200 bps with a radio set to ISB mode and an HF modem set to a fixed data rate. It is possible to use code combining techniques and ARQ.

Figure 7:
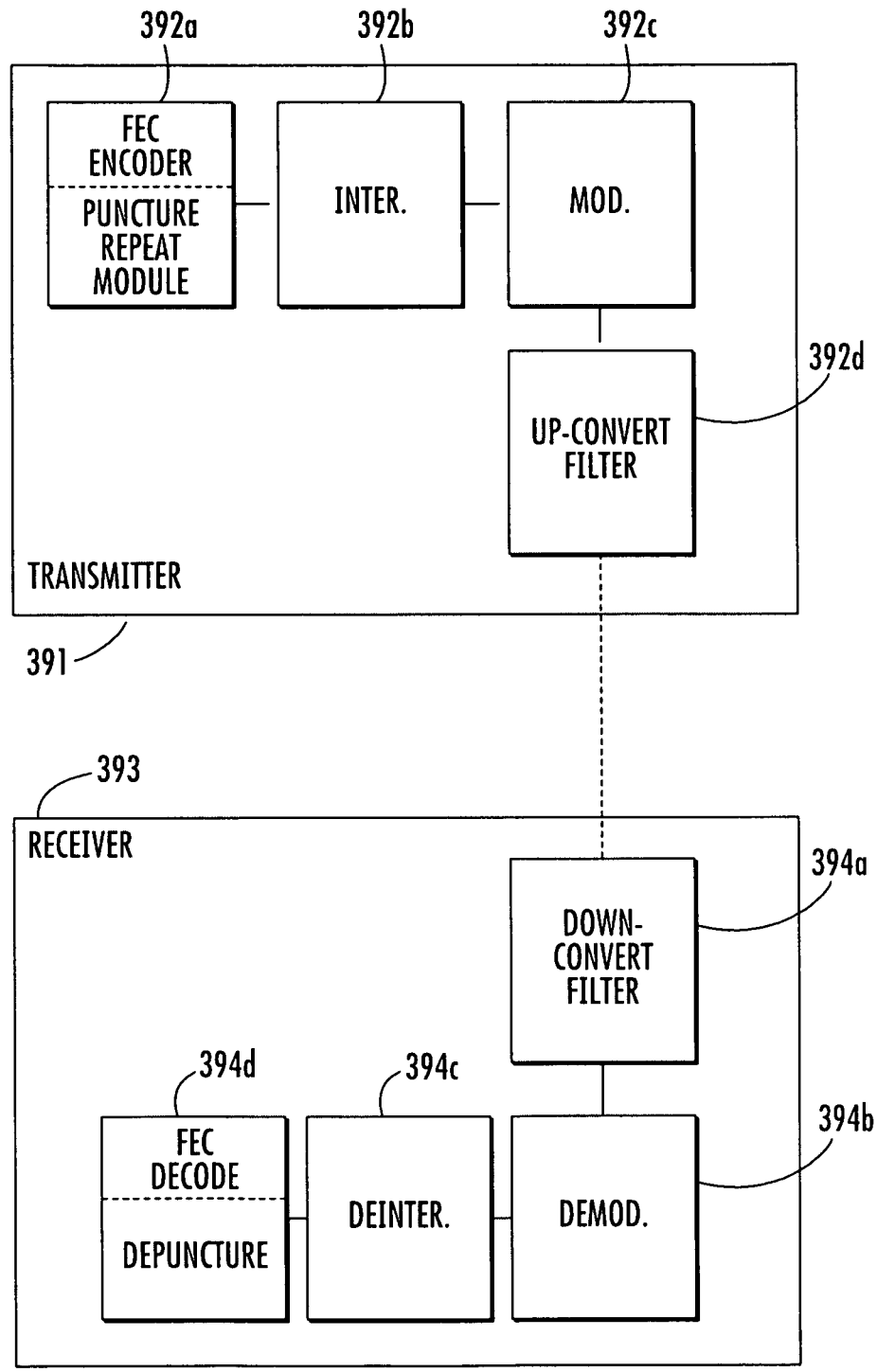

A communications system that incorporates communications devices can be used in accordance with non-limiting examples of the present invention and is shown in FIG. 7. A transmitter is shown at 391 and includes basic functional circuit components or modules, including a forward error correction encoder 392a that includes a puncturing module, which could be integral to the encoder or a separate module. The decoder 392a and its puncturing module includes a function for repeating as will be explained below. Encoded data is interleaved at an interleaver 392b, for example, a block interleaver, and in many cases modulated at modulator 392c. This modulator can map the communications data into different symbols based on a specific mapping algorithm to form a communications signal. For example, it could form Minimum Shift Keying or Gaussian Minimum Shift Keying (MSK or GMSK) symbols. Other types of modulation could be used in accordance with non-limiting examples of the present invention. Up-conversion and filtering occurs at an up-converter and filter 392d, which could be formed as an integrated module or separate modules. Communications signals are transmitted, for example, wirelessly to receiver 393.

At the receiver 393, down conversion and filtering occurs at a down converter and filter 394a, which could be integrated or separate modules. The signal is demodulated at demodulator 394b and deinterleaved at deinterleaver 394c. The deinterleaved data (i.e., bit soft decisions) is decoded and depunctured (for punctured codes), combined (for repeated codes) and passed through (for standard codes) at decoder 394d, which could include a separate or integrated depuncturing module. The system, apparatus and method can use different modules and different functions. These components as described could typically be contained within one transceiver.

It should be understood, in one non-limiting aspect of the present invention, a rate 1/2, K=7 convolutional code can be used as an industry standard code for forward error correction (FEC) during encoding. For purposes of understanding, a more detailed description of basic components now follows. A convolutional code is an error-correcting code, and usually has three parameters (n, k, m) with n equal to the number of output bits, k equal to the number of input bits, and m equal to the number of memory registers, in one non-limiting example. The quantity k/n could be called the code rate with this definition and is a measure of the efficiency of the code. K and n parameters can range from 1 to 8, m can range from 2 to 10, and the code rate can range from 1/8 to 7/8 in non-limiting examples. Sometimes convolutional code chips are specified by parameters (n, k, L) with L equal to the constraint length of the code as L=k (m−1). Thus, the constraint length can represent the number of bits in an encoder memory that would affect the generation of n output bits. Sometimes the letters may be switched depending on the definitions used.

The transformation of the encoded data is a function of the information symbols and the constraint length of the code. Single bit input codes can produce punctured codes that give different code rates. For example, when a rate 1/2 code is used, the transmission of a subset of the output bits of the encoder can convert the rate 1/2 code into a rate 2/3 code. Thus, one hardware circuit or module can produce codes of different rates. Punctured codes allow rates to be changed dynamically through software or hardware depending on channel conditions, such as rain or other channel impairing conditions.

An encoder for a convolutional code typically uses a look-up table for encoding, which usually includes an input bit as well as a number of previous input bits (known as the state of the encoder), the table value being the output bit or bits of the encoder. It is possible to view the encoder function as a state diagram, a tree diagram or a trellis diagram.

Decoding systems for convolutional codes can use 1) sequential decoding, or 2) maximum likelihood decoding, also referred to as Viterbi decoding, which typically is more desirable. Sequential decoding allows both forward and backward movement through the trellis. Viterbi decoding as maximum likelihood decoding examines a receive sequence of given length, computes a metric for each path, and makes a decision based on the metric.

Puncturing convolutional codes is a common practice in some systems and is used in accordance with non-limiting examples of the present invention. It should be understood that in some examples a punctured convolutional code is a higher rate code obtained by the periodic elimination of specific code bits from the output of a low rate encoder. Punctured convolutional code performance can be degraded compared with original codes, but typically the coding rate increases.

Some of the basic components that could be used as non-limiting examples of the present invention include a transmitter that incorporates a convolutional encoder, which encodes a sequence of binary input vectors to produce the sequence of binary output vectors and can be defined using a trellis structure. An interleaver, for example, a block interleaver, can permute the bits of the output vectors. The interleaved data would also be modulated at the transmitter (by mapping to transmit symbols) and transmitted. At a receiver, a demodulator demodulates the signal.

A block deinterleaver recovers the bits that were interleaved. A Viterbi decoder could decode the deinterleaved bit soft decisions to produce binary output data.

Often a Viterbi forward error correction module or core is used that would include a convolutional encoder and Viterbi decoder as part of a radio transceiver as described above. For example if the constraint length of the convolutional code is 7, the encoder and Viterbi decoder could support selectable code rates of 1/2, 2/3, 3/4, 4/5, 5/6, 6/7, 7/8 using industry standard puncturing algorithms.

Different design and block systems parameters could include the constraint length as a number of input bits over which the convolutional code is computed, and a convolutional code rate as the ratio of the input to output bits for the convolutional encoder. The puncturing rate could include a ratio of input to output bits for the convolutional encoder using the puncturing process, for example, derived from a rate 1/2 code.

The Viterbi decoder parameters could include the convolutional code rate as a ratio of input to output bits for the convolutional encoder. The puncture rate could be the ratio of input to output bits for the convolutional encoder using a puncturing process and can be derived from a rate 1/2 mother code. The input bits could be the number of processing bits for the decoder. The Viterbi input width could be the width of input data (i.e. soft decisions) to the Viterbi decoder. A metric register length could be the width of registers storing the metrics. A trace back depth could be the length of path required by the Viterbi decoder to compute the most likely decoded bit value. The size of the memory storing the path metrics information for the decoding process could be the memory size. In some instances, a Viterbi decoder could include a First-In/First-Out (FIFO) buffer between depuncture and Viterbi function blocks or modules. The Viterbi output width could be the width of input data to the Viterbi decoder.

The encoder could include a puncturing block circuit or module as noted above. Usually a convolutional encoder may have a constraint length of 7 and take the form of a shift register with a number of elements, for example, 6. One bit can be input for each clock cycle. Thus, the output bits could be defined by a combination of shift register elements using a standard generator code and be concatenated to form an encoded output sequence. There could be a serial or parallel byte data interface at the input. The output width could be programmable depending on the punctured code rate of the application.

A Viterbi decoder in non-limiting examples could divide the input data stream into blocks, and estimate the most likely data sequence. Each decoded data sequence could be output in a burst. The input and calculations can be continuous and require four clock cycles for every two bits of data in one non-limiting example. An input FIFO can be dependent on a depuncture input data rate.

It should also be understood that the radio device is not limited to convolutional codes and similar FEC, but also turbo codes could be used as high-performance error correction codes or low-density parity-check codes that approach the Shannon limit as the theoretical limit of maximum information transfer rate over a noisy channel. Thus, some available bandwidth can be increased without increasing the power of the transmission. Instead of producing binary digits from the signal, the front-end of the decoder could be designed to produce a likelihood measure for each bit.

The system, in accordance with non-limiting examples of the present invention, can be used in multiprocessor embedded systems and related methods and also used for any type of radio software communications architecture as used on mainframe computers or small computers, including laptops with an added transceiver, such as used by military and civilian applications, or in a portable wireless communications device 420 as illustrated in FIG. 8. The portable wireless communications device is illustrated as a radio that can include a transceiver as an internal component and handheld housing 422 with an antenna 424 and control knobs 426. A Liquid Crystal Display (LCD) or similar display can be positioned on the housing in an appropriate location for display. The various internal components, including dual processor systems for red and black subsystems and software that is conforming with SCA, is operative with the illustrated radio. Although a portable or handheld radio is disclosed, the architecture as described can be used with any processor system operative with the system in accordance with non-limiting examples of the present invention. An example of a communications device that could incorporate the communications system in accordance with non-limiting examples of the present invention, is the Falcon® III manpack or tactical radio platform manufactured by Harris Corporation of Melbourne, Fla.

This application is related to copending patent applications entitled, "COMMUNICATIONS DEVICE USING MEASURED SIGNAL-TO-NOISE RATIO TO ADJUST PHASE AND FREQUENCY TRACKING," which is filed on the same date and by the same assignee and inventors, the disclosure which is hereby incorporated by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A communications device, comprising:
a phase and frequency tracking loop having a signal input and an adjustable loop filter that establishes a predetermined tracking loop bandwidth for samples of communications signals received at the signal input and processed within the tracking loop; and
a tracking loop update circuit that updates loop filter operating parameters and operative with the loop filter for increasing or decreasing the tracking loop bandwidth of the phase and frequency tracking loop based on the dynamics of the frequency offset of measured samples from the output of the loop filter over time, wherein said tracking loop update circuit further comprises a burst history circuit that is operative for maintaining a history of previous signal receptions to determine a signal burst history, and said tracking loop update circuit updates the tracking loop parameters based on the dynamics of the frequency offset of measured samples from the output of the loop filter over time and the signal burst history.

2. The communications device according to claim 1, wherein said tracking loop update circuit further comprises a frequency offset and frequency-delta tracking circuit that is operative for determining the frequency offset of measured samples from the loop filter over time.

3. The communications device according to claim 1, wherein said tracking loop update circuit further comprises a signal-to-noise ratio estimator that receives the samples of communications signals and estimates the signal-to-noise level within the communications signals that are output by the tracking loop, and said tracking loop update circuit updates loop filter operating parameters based on the dynamics of the frequency offset of measured samples from the output of the loop filter over time and the measured signal-to-noise ratio.

4. The communications device according to claim 3, wherein the tracking bandwidth within the phase and frequency tracking loop is reduced when the signal-to-noise ratio within received samples of communications signals has been reduced.

5. The communications device according to claim 1, wherein the tracking loop update circuit further comprises a symbol rate configuration circuit that is operative for determining the tracking capabilities of the demodulator based on the symbol rate, and said tracking loop update circuit updates the tracking loop parameters based on the dynamics of frequency offset of measured samples from the output of the loop filter over time and the current demodulator tracking capability.

6. The communications device according to claim 1, wherein the tracking loop update circuit further comprises a filter bandwidth logic circuit connected to the loop filter that calculates the updated filter parameters and generates the updated filter parameters to the loop filter.

7. The communications device according to claim 1, wherein said phase and frequency tracking loop comprises a phase-locked loop circuit.

8. The communications device according to claim 7, wherein said phase-locked loop circuit further comprises a mixer connected to the signal input, a phase detector that receives signals output from the mixer and connected to the loop filter, and numerically controlled oscillator connected to the mixer and the output of the loop filter.

9. The communications device according to claim 1, wherein said tracking loop update circuit is operative for updating filter parameters for tracking a Demand Assigned Multiple Access (DAMA) waveform.

10. The communications device according to claim 1, and further comprising a demodulator that incorporates the phase and frequency tracking loop and the tracking loop update circuit.

11. A phase-locked loop circuit in a communications device, comprising:
a signal input;
a mixer connected to the signal input;
a phase detector that receives signals output from the mixer;
a loop filter connected to the phase detector that establishes a predetermined tracking loop bandwidth for samples of communications signals received at the signal input and processed within the phase-locked loop;
a numerically controlled oscillator connected to the mixer and the output of the loop filter; and
a loop update circuit comprising a frequency offset and frequency-delta tracking circuit operative for determining the dynamics of the frequency offset of measured samples from the loop filter over time and a filter bandwidth logic circuit connected to the loop filter and frequency offset and frequency-delta tracking circuit that calculates updated filter parameters and generates the updated filter parameters to the loop filter for increasing or decreasing the tracking loop bandwidth based on the dynamics of the frequency offset of measured samples from the loop filter over time, wherein said loop update circuit further comprises a burst history circuit connected to the filter bandwidth logic circuit and operative for maintaining a history of previous signal receptions to determine a signal burst history, and said filter bandwidth logic circuit calculates updated filter parameters based on the dynamics of the frequency offset of measured samples from the loop filter over time and the signal burst history.

12. The phase-locked loop circuit according to claim 11, wherein said loop update circuit further comprises a symbol rate configuration circuit connected to the filter bandwidth logic circuit and operative for determining the tracking capability of the demodulator based on the symbol rate, and said filter bandwidth logic circuit calculates updated filter parameters based on the dynamics of the frequency offset of measured samples from the loop filter over time and the current tracking capability of the demodulator.

13. The phase-locked loop circuit according to claim 11, wherein said loop update circuit further comprises a signal-to-noise ratio estimator connected to the filter bandwidth logic circuit and operative for receiving the samples of communications signals and estimating the noise level within the communications signals, and said filter bandwidth logic circuit calculates updated filter parameters based on the measured signal-to-noise ratio and the dynamics of the frequency offset of measured samples from the loop filter over time.

14. The phase-locked loop circuit according to claim 13, wherein the tracking bandwidth is reduced when the signal-to-noise ratio within received samples of communications signals has been reduced.

15. A method of communicating data, comprising:
receiving a communications signal within a phase and frequency tracking loop having an adjustable loop filter;
establishing a predetermined tracking loop bandwidth for samples of received communications signals processed within the tracking loop;
determining the dynamics of the frequency offset of measured samples from the loop filter over time; and
updating loop filter operating parameters using A tracking loop update circuit to increase or decrease the tracking loop bandwidth of the phase and frequency tracking loop based on the dynamics of the frequency offset of measured samples from the loop filter over time and further comprising, maintaining a history of previous signal receptions to determine a signal burst history, and the tracking loop update circuit updates the tracking loop parameters based or the dynamics of the frequency offset of measured samples from the loop filter over time and the signal burst history.

16. The method according to claim 15, which further comprises determining the tracking capability of the demodulator based on the symbol rate, and the tracking loop update circuit updates the tracking loop parameters based on the dynamics of the frequency offset of measured samples from the loop filter over time and the current tracking capability of the demodulator.

17. The method according to claim 15, which further comprises determining the signal-to-noise level within the communications signals that are input to the tracking loop, and the tracking loop update circuit updates loop filter operating parameters based on the measured signal-to-noise ratio and the dynamics of the frequency offset of measured samples from the loop filter over time.

18. The method according to claim 17, which further comprises reducing the tracking bandwidth within the phase and frequency tracking loop when the signal-to-noise ratio within received samples of communications signals has been reduced.

19. The method according to claim 15, which further comprises updating filter parameters for tracking a Demand Assigned Multiple Access (DAMA) waveform.

20. The method according to claim 15, which further comprises processing the communications signals within a phase-locked loop circuit comprising a mixer connected to the signal input, a phase detector that receives signals output from the mixer and connected to the loop filter, and numerically controlled oscillator connected to the mixer and the output of the loop filter.

21. A communications device, comprising:
a phase and frequency tracking loop having a signal input and an adjustable loop filter that establishes a predetermined tracking loop bandwidth for samples of communications signals received at the signal input and processed within the tracking loop; and
a tracking loop update circuit that updates loop filter operating parameters and operative with the loop filter for increasing or decreasing the tracking loop bandwidth of the phase and frequency tracking loop based on the dynamics of the frequency offset of measured samples from the output of the loop filter over time, wherein said tracking loop update circuit further comprises a signal-to-noise ratio estimator that receives the samples of communications signals and estimates the signal-to-noise level within the communications signals that are output by the tracking loop, and said tracking loop update circuit updates loop filter operating parameters based on the dynamics of the frequency offset of measured samples from the output of the loop filter over time and the measured signal-to-noise ratio.

22. A communications device, comprising:
a phase and frequency tracking loop having a signal input and an adjustable loop filter that establishes a predetermined tracking loop bandwidth for samples of communications signals received at the signal input and processed within the tracking loop; and
a tracking loop update circuit that updates loop filter operating parameters and operative with the loop filter for increasing or decreasing the tracking loop bandwidth of the phase and frequency tracking loop based on the dynamics of the frequency offset of measured samples from the output of the loop filter over time, wherein the tracking loop update circuit further comprises a symbol rate configuration circuit that is operative for determining the tracking capabilities of the demodulator based on the symbol rate, and said tracking loop update circuit updates the tracking loop parameters based on the dynamics of frequency offset of measured samples from the output of the loop filter over time and the current demodulator tracking capability.

23. A method of communicating data, comprising:
receiving a communications signal within a phase and frequency tracking loop having an adjustable loop filter;
establishing a predetermined tracking loop bandwidth for samples of received communications signals processed within the tracking loop;
determining the dynamics of the frequency offset of measured samples from the loop filter over time;
updating loop filter operating parameters using a tracking loop updated circuit to increase or decrease the tracking loop bandwidth of the phase and frequency tracking loop based on the dynamics of the frequency offset of measured samples from the loop filter over time; and
determining the tracking capability of the demodulator based on the symbol rate, and the tracking loop update circuit updates the tracking loop parameters based on the dynamics of the frequency offset of measured samples from the loop filter over time and the current tracking capability of the demodulator.

\* \* \* \* \*